United States Patent
Chang et al.

(10) Patent No.: US 10,991,595 B1
(45) Date of Patent: Apr. 27, 2021

(54) DRY ETCHING PROCESS FOR MANUFACTURING TRENCH STRUCTURE OF SEMICONDUCTOR APPARATUS

(71) Applicant: TAIWAN CARBON NANO TECHNOLOGY CORPORATION, Miaoli County (TW)

(72) Inventors: Kuang-Jui Chang, Miaoli County (TW); Yu-Hsuan Liao, Miaoli County (TW); Chun-Hsien Tsai, Miaoli County (TW); Ting-Chuan Lee, Miaoli County (TW); Chun-Jung Tsai, Miaoli County (TW)

(73) Assignee: TAIWAN CARBON NANO TECHNOLOGY CORPORATION, Zhunan Township, Miaoli County (TW)

( * ) Notice: Subject to any disclaimer, the term of this patent is extended or adjusted under 35 U.S.C. 154(b) by 0 days.

(21) Appl. No.: 17/020,379

(22) Filed: Sep. 14, 2020

(30) Foreign Application Priority Data

Jun. 3, 2020 (TW) ................................ 109118620

(51) Int. Cl.
*H01L 21/311* (2006.01)
*H01L 21/67* (2006.01)

(52) U.S. Cl.
CPC .. *H01L 21/31138* (2013.01); *H01L 21/67069* (2013.01)

(58) Field of Classification Search
None
See application file for complete search history.

(56) References Cited

FOREIGN PATENT DOCUMENTS

KR 2009009389 A * 1/2009

* cited by examiner

*Primary Examiner* — Roberts P Culbert
(74) *Attorney, Agent, or Firm* — Muncy, Geissler, Olds & Lowe, P.C.

(57) ABSTRACT

A dry etching process for manufacturing a trench structure of a semiconductor apparatus, including the steps of: step 1, providing a semiconductor substrate, wherein the semiconductor substrate is provided with a patterned photoresist layer and placed in a reaction chamber; step 2, introducing a first etching gas into the reaction chamber to perform a first etching process to form a trench, wherein the first etching gas includes sulfur hexafluoride, oxygen, helium, nitrogen trifluoride, and a first organic silicide; step 3, introducing a second etching gas into the reaction chamber to perform a second etching process to further etch the trench, wherein the second etching gas includes sulfur hexafluoride, oxygen, helium, and a second organic silicide; and step 4, introducing a third etching gas into the reaction chamber to perform a third etching process, wherein the third etching gas includes hydrobromic acid, oxygen, and helium.

10 Claims, 5 Drawing Sheets

DRY ETCHING PROCESS FOR MANUFACTURING TRENCH STRUCTURE OF SEMICONDUCTOR APPARATUS

FIELD OF THE INVENTION

The invention relates to an etching process, in particular to a dry etching process for manufacturing a trench structure of a semiconductor apparatus.

BACKGROUND OF THE INVENTION

The semiconductor industry is undergoing constant and vigorous development. Technological advances in semiconductor design and materials have led to smaller, more complex circuits for semiconductor apparatuses. Generally, the functional density of the semiconductor apparatus is increased and the size is smaller, as a result, the production efficiency can be improved and the cost can be reduced.

The function of a semiconductor apparatus is limited by the area of a semiconductor chip, and with the development of semiconductor technologies, more and more apparatuses employ three-dimensional stacking techniques to increase the density of components. However, the three-dimensional stacking technique complicates the process for manufacturing the semiconductor apparatus, makes it more difficult to keep the quality and stability of the process for manufacturing the semiconductor apparatus, and affects yield. For three-dimensional integrated circuit semiconductor chips, a high aspect ratio of a trench is required.

Typically, a deep reactive-ion etching (DRIE) process developed by Bosch Corporation has been used to manufacture trenches. However, the conventional DRIE process still has the problem that a sidewall of the trench is quite rough, thereby affecting the electrical and mechanical properties of the semiconductor chip.

Therefore, it's desirable to strive for a corresponding development in the manufacturing process of semiconductor apparatuses to improve the quality and stability of the manufacturing process.

SUMMARY OF THE INVENTION

It's an object of the invention to improve the quality and stability of a semiconductor apparatus and increase the yield by providing a dry etching process for manufacturing a trench of a semiconductor apparatus.

Other objects and advantages of the present invention can be further understood from the technical features disclosed hereafter.

The dry etching process for manufacturing a trench of a semiconductor apparatus comprises the steps of: step 1, providing a semiconductor substrate, the semiconductor substrate being provided with a photoresist layer which is patterned thereon and placed in a reaction chamber, the semiconductor substrate including a reserved area shielded by the photoresist layer and a predetermined etching area which is exposed, and the reaction chamber comprising an upper electrode and a lower electrode; step 2, introducing a first etching gas into the reaction chamber to perform a first etching process, and removing a part of the predetermined etching area to form a trench, the trench including a first depth, and the first etching gas comprising sulfur hexafluoride, oxygen, helium, nitrogen trifluoride and a first organic silicide; step 3, introducing a second etching gas into the reaction chamber to perform a second etching process, and further etching the trench from the first depth to a second depth, the second etching gas comprising sulfur hexafluoride, oxygen, helium and a second organic silicide, wherein a pressure in the reaction chamber in the second etching process is higher than a pressure in the reaction chamber in the first etching process; and step 4, introducing a third etching gas into the reaction chamber to perform a third etching process, the third etching gas comprising hydrobromic acid, oxygen, and helium, wherein a temperature in the reaction chamber varies within +/−1% per second, a pressure in the reaction chamber varies within +/−5% per second, and a power of the upper electrode or the lower electrode varies within +/−1% per second.

In an embodiment of the invention, in the first etching process, a flow rate of sulfur hexafluoride is between 10 sccm and 2000 sccm, a flow rate of oxygen is between 10 sccm and 500 sccm, a flow rate of helium is between 10 sccm and 500 sccm, a flow rate of nitrogen trifluoride is between 10 sccm and 300 sccm, and a flow rate of the first organic silicide is between 50 sccm and 200 sccm.

In an embodiment of the present invention, in the first etching process, sulfur hexafluoride is 30% by volume of the first etching gas, oxygen is 20% by volume of the first etching gas, helium is 20% by volume of the first etching gas, nitrogen trifluoride is 10% by volume of the first etching gas, and the first organic silicide is 20% by volume of the first etching gas.

In an embodiment of the present invention, in the first etching process, a power of the upper electrode is 3000 W, and a power of the lower electrode is 500 W.

In an embodiment of the present invention, in the second etching process, a flow rate of sulfur hexafluoride is between 10 sccm and 2000 sccm, a flow rate of oxygen is between 10 sccm and 500 sccm, a flow rate of helium is between 10 sccm and 500 sccm, and a flow rate of the second organic silicide is between 50 sccm and 200 sccm.

In an embodiment of the present invention, in the second etching process, sulfur hexafluoride is 20% by volume of the second etching gas, oxygen is 20% by volume of the second etching gas, helium is 40% by volume of the second etching gas, and the second organic silicide is 20% by volume of the second etching gas.

In an embodiment of the present invention, in the second etching process, a power of the upper electrode is 7000 W, and a power of the lower electrode is 2000 W.

In an embodiment of the present invention, in the third etching process, a flow rate of hydrobromic acid is between 10 sccm and 2000 sccm, a flow rate of oxygen is between 10 sccm and 500 sccm, and a flow rate of helium is between 10 sccm and 500 sccm.

In an embodiment of the present invention, in the third etching process, hydrobromic acid is 60% by volume of the third etching gas, oxygen is 10% by volume of the third etching gas, and helium is 30% by volume of the third etching gas.

In an embodiment of the present invention, in the third etching process, a power of the upper electrode is 1000 W, and a power of the lower electrode is 100 W.

According to the dry etching process for manufacturing the trench structure of the semiconductor apparatus, the first etching process, the second etching process and the third etching process are respectively carried out through the first etching gas, the second etching gas and the third etching gas to manufacture a semiconductor structure with a deep trench, as a result, the quality and stability of the process can be improved, and the yield can be increased.

To facilitate the understanding of features and advantages of the present invention, a detailed description of the invention will be provided with reference to the accompanying drawings.

DETAILED DESCRIPTION OF THE PREFERRED EMBODIMENTS

The foregoing and other technical aspects, features and advantages of the invention will be apparent from the following detailed description of a preferred embodiment, taken in conjunction with the figures. Directional terms mentioned in the following embodiments, for example, up, down, left, right, front or rear, refer to directions indicated only with reference to the figures. Accordingly, directional terms are intended only for description and not for limitation. As used herein, the terms "about" and "approximately" generally refer to a variation within 10%, or within 5%, or within 3%, or within 2%, or within 1%, or within 0.5% around a given value or range. The numbers given herein are approximate numbers, i.e., the meaning of "about" or "approximately" may still be implied without specifically reciting "about" or "approximately".

Figure 1:
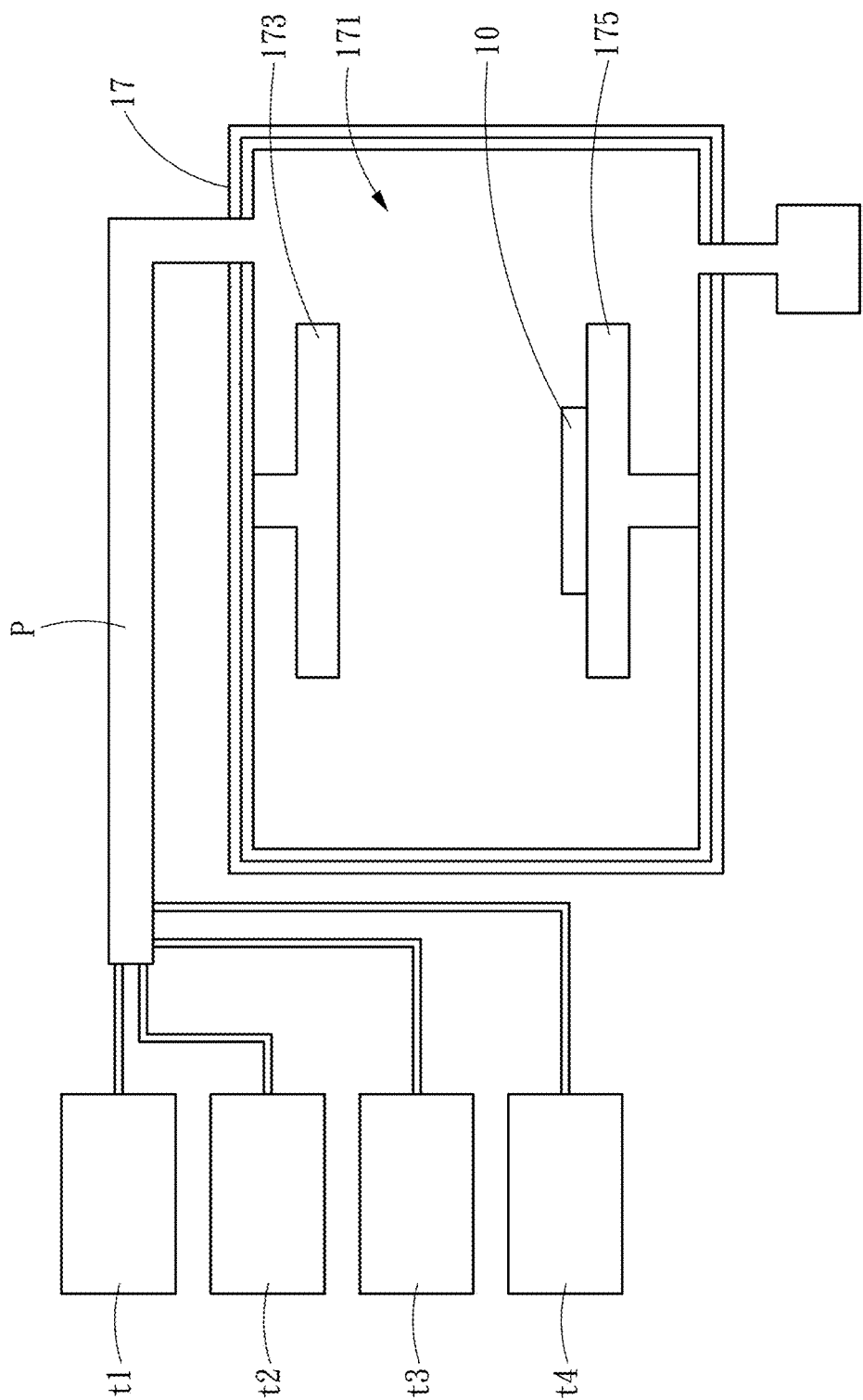
FIG. 1 is a schematic view of a dry etching apparatus for manufacturing a trench structure of a semiconductor apparatus according to an embodiment of the present invention.

Referring to FIG. 1, a schematic view of a dry etching apparatus 17 for manufacturing a trench structure of a semiconductor apparatus 10 according to an embodiment of the present invention.

Figure 2A:
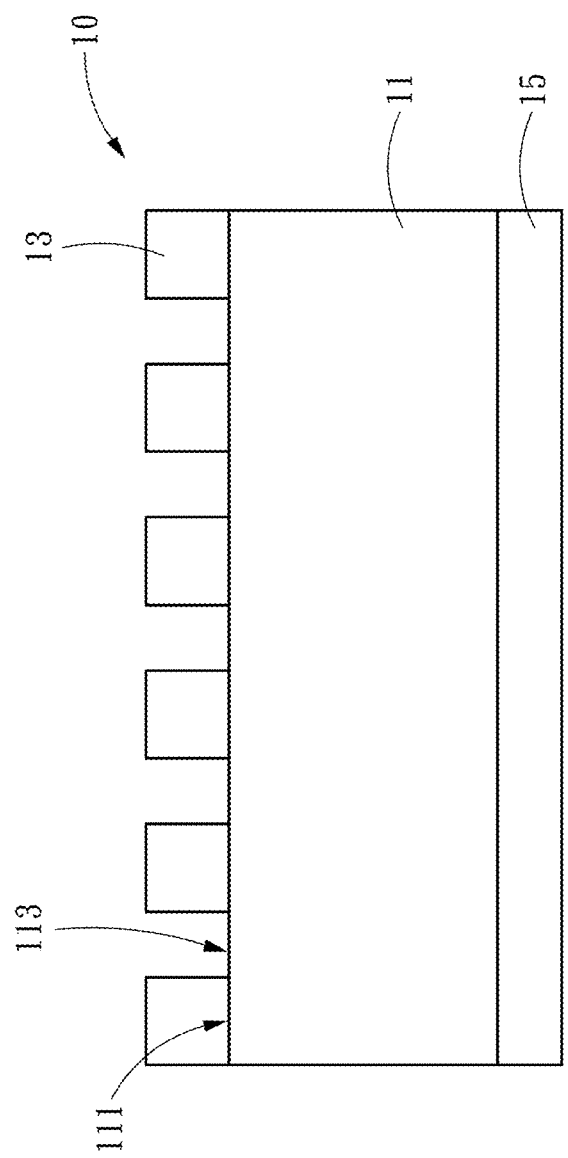
FIG. 2A, FIG. 2B, FIG. 2C and FIG. 2D are cross-sectional views illustrating intermediate stages of a dry etching process for manufacturing a trench structure of a semiconductor apparatus according to some embodiments.

Also referring to FIG. 2A, FIG. 2B, FIG. 2C, FIG. 2D, which are cross-sectional views illustrating intermediate stages of a dry etching process for manufacturing a trench structure of the semiconductor apparatus 10 in accordance with some embodiments. As shown in FIG. 2A, the dry etching process for manufacturing a trench structure of the semiconductor apparatus 10 of the embodiment includes the following steps.

Step 1: a semiconductor substrate 11 is provided. The semiconductor substrate 11 is provided with a patterned photoresist layer 13 and placed in a reaction chamber 171 (shown in FIG. 1). The semiconductor substrate 11 includes a reserved area 111 shielded by the photoresist layer 13 and a predetermined etching area 113 which is exposed. The reaction chamber 171 includes an upper electrode 173 and a lower electrode 175. The material of the semiconductor substrate 11 includes, for example, silicon. The reaction chamber 171 is provided inside the dry etching apparatus 17 (shown in FIG. 1).

In addition, the semiconductor apparatus 10 may include an oxide layer 15. The oxide layer 15 is disposed below the semiconductor substrate 11.

For convenience of explanation, FIG. 2A, FIG. 2B, FIG. 2C and FIG. 2D do not depict the dry etching apparatus 17. Next, refer to FIG. 2B.

Step 2: a first etching gas (g1) is introduced into the reaction chamber 171 to perform a first etching process (E1) to remove a part of the predetermined etching area 113 to form a trench 19a.

The trench 19a includes a first depth (d1). In the embodiment, the first etching gas (g1) includes sulfur hexafluoride ($SF_6$), oxygen ($O_2$), helium (He), nitrogen trifluoride ($NF_3$), and a first organic silicide.

Figure 2B:
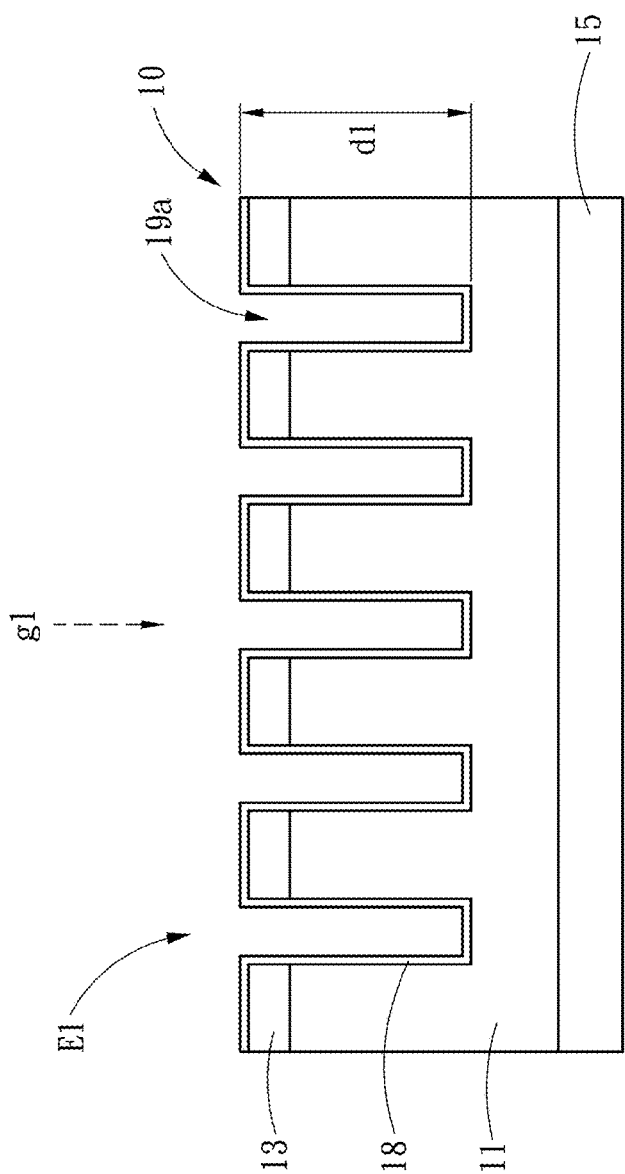
Figure 2C:
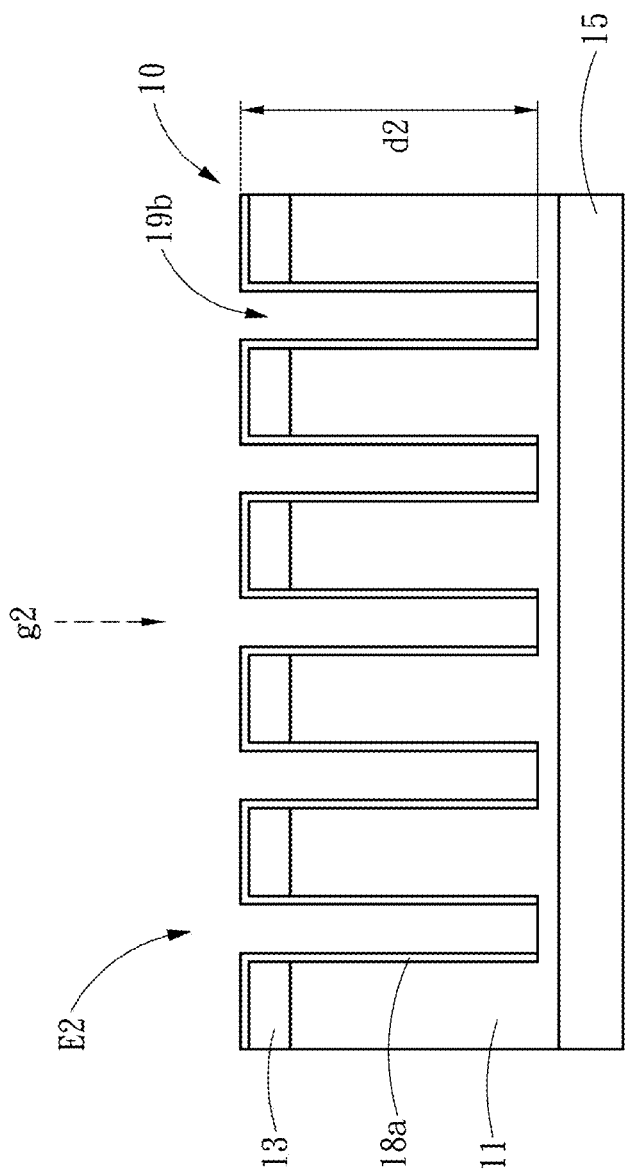

Step 3: as shown in FIG. 2C, a second etching gas (g2) is introduced into the reaction chamber 171 to perform a second etching process (E2) to further etch the trench 19a from the first depth (d1) to a second depth (d2). The second etching process (E2) also removes the oxide at a bottom of the trench 19a to form a trench 19b. The trench 19b is partially covered with a protective layer 18a. In the embodiment, the second etching gas (g2) includes sulfur hexafluoride ($SF_6$), oxygen ($O_2$), helium (He), and a second organic silicide.

Figure 2D:
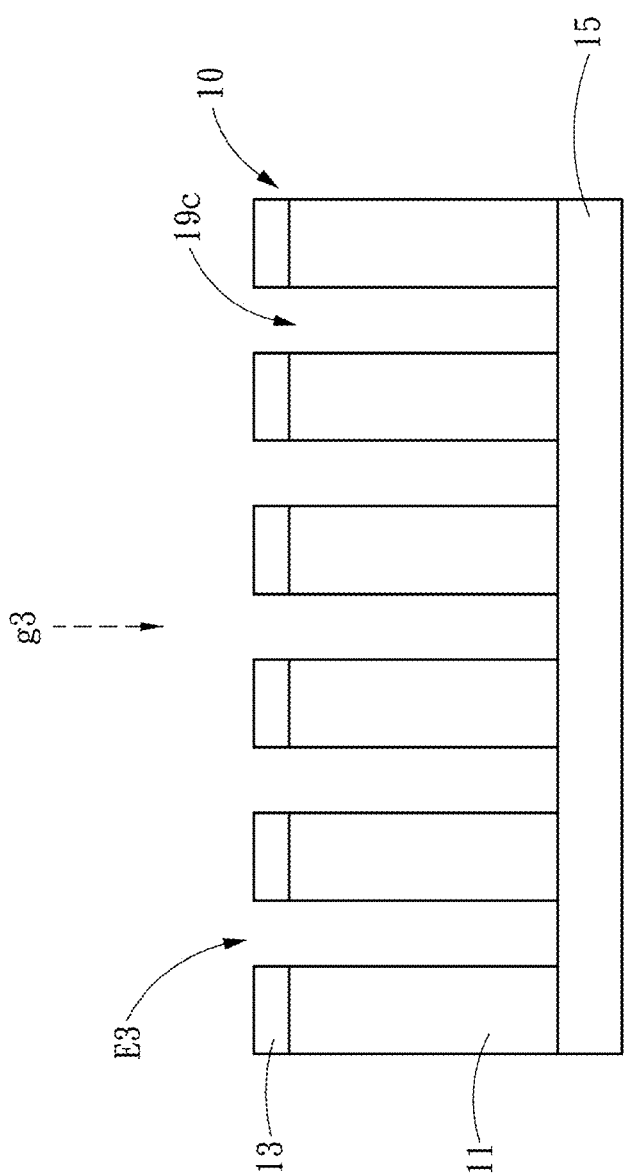

Step 4: as shown in FIG. 2D, a third etching gas (g3) is introduced into the reaction chamber 171 to perform a third etching process (E3). The third etching gas includes hydrobromic acid (HBr), oxygen ($O_2$), and helium (He). In the third etching process (E3), the trench 19b is further etched from the second depth (d2) to the oxide layer 15 to form a trench 19c. The third etching gas (g3) does not etch the oxide layer 15.

In the embodiment, the temperature in the reaction chamber 171 varies within +/−1% per second.

In the embodiment, the pressure in the reaction chamber 171 varies within +/−5% per second.

In the embodiment, the power of the upper electrode 173 or the lower electrode 175 varies within +/−1% per second.

As shown in FIG. 1, in particular, the dry etching apparatus 17 may include a plurality of tanks t1, t2, t3, t4 and a pipeline p. The tanks t1, t2, t3, t4 are used to store the gas required for each etching process, and the pipeline (p) is used to transfer the gas required for each etching process to the reaction chamber 171. The invention does not limit the number of the tanks and store location and store method of the etching gas. The upper electrode 173 and the lower electrode 175 are used to affect etching gases for etching, the details will not be described herein. The first organic silicide and/or the second organic silicide may be implemented, for example, as dichlorosilane ($H_2SiCl_2$) gas.

In detail, in step 1, the predetermined etching area 113 which is exposed of the semiconductor substrate 11 produces a native oxide (not shown). In the first etching process (E1) of step 2, the oxide can be decomposed only by etching with the first etching gas (g1), so as to continue with the etching. Sulfur hexafluoride ions and radicals can etch the silicon of the semiconductor substrate 11. As shown in the protective layer 18 shown in FIG. 2B, the first organic silicide reacts with oxygen to form silicon oxide ($SiO_2$) to protect the top and the sidewall of the photoresist layer 13. Oxygen reacts with silicon and fluorine to form a silicon oxyfluoride ($SiO_xF_y$) polymer to protect the sidewall of the trench 19a from sulfur hexafluoride ions and radicals. Nitrogen trifluoride is used to etch the oxide polymer on the photoresist layer 13 and the silicon oxyfluoride polymer on the sidewall of the trench 19a to control the profile of the trench 19a.

In FIG. 2A, a thickness of the semiconductor substrate 11 is, for example, about 600 μm, and a thickness of the photoresist layer 13 is, for example, about 20 μm. In FIG. 2B, a width of the trench 19a is, for example, about 5 μm, and a thickness of the protective layer 18 is, for example, about 30 nm.

In the embodiment, a pressure in the reaction chamber 171 in the second etching process (E2) (step 3) is greater than a pressure in the reaction chamber 171 in the first etching process (E1) (step 2).

In the embodiment, in the first etching process (E1) (step 2), a flow rate of sulfur hexafluoride is between 10 sccm and 2000 sccm, a flow rate of oxygen is between 10 sccm and 500 sccm, a flow rate of helium is between 10 sccm and 500 sccm, a flow rate of nitrogen trifluoride is between 10 sccm and 300 sccm, and a flow rate of the first organic silicide is between 50 sccm and 200 sccm.

In the embodiment, in the first etching process (E1) (step 2), sulfur hexafluoride is 30% by volume of the first etching gas (g1), oxygen is 20% by volume the first etching gas (g1), helium is 20% by volume of the first etching gas (g1), nitrogen trifluoride is 10% by volume of the first etching gas (g1), and the first organic silicide is 20% by volume of the first etching gas (g1).

In the embodiment, in the first etching process (E1) (step 2), a power of the upper electrode 173 is about 3000 W, and a power of the lower electrode 175 is about 500 W.

In addition, in the first etching process (E1), to etch deeper, the pressure of the reaction chamber 171 must be as low as less than 100 mT (milli-Torr). In the first etching process (E1), the first etching process (E1) must last longer than 30 seconds to reduce gas flow instabilities in the Bosch deep reactive ion etching and to reduce accidental interruption during the etching process.

In the embodiment, after the first etching process (E1), the thickness of the photoresist layer 13 may remain ⅔ to ½ of the original thickness. As previously described, polymers may be deposited to protect the photoresist layer 13 and the sidewall of the trench 19a. The pressure in the reaction chamber 171 must be greater than 150 mT. The power of the upper electrode 173 is below 7000 w, and the power of the lower electrode 175 is below 50 w. At this time, the gas includes about 40 vol. % oxygen and 60 vol. % Si organic compounds.

In detail, in the second etching process (E2) of step 3, helium may reduce the concentration of sulfur hexafluoride, may reduce the etching rate, and may reduce the growth of polymers at the bottom of the trench.

In the embodiment, in the second etching process (E2) (step 3), a flow rate of sulfur hexafluoride is between 10 sccm and 2000 sccm, a flow rate of oxygen is between 10 sccm and 500 sccm, a flow rate of helium is between 10 sccm and 500 sccm, and a flow rate of the second organic silicide is between 50 sccm and 200 sccm.

In the embodiment, in the second etching process (E2) (step 3), sulfur hexafluoride is 20% of the second etching gas (g2), oxygen is 20% of the second etching gas (g2), helium is 40% of the second etching gas (g2), the second organic silicide is 20% of the second etching gas (g2).

In the embodiment, in the second etching process (E2) (step 3), the power of the upper electrode 173 is about 7000 W, and the power of the lower electrode 175 is about 2000 W.

In the embodiment, since the second etching gas (g2) etches the material of the oxide layer 15, the third etching process (E3) must be performed. The third etching gas (g3) does not etch the material of the oxide layer 15.

In detail, the third etching process (E3) of step 4 is an over-etching process. The third etching process (E3) uses hydrobromic acid, oxygen and helium to deposit polymers (not shown) to protect the photoresist layer 13 and the trench 19c. Hydrobromic acid is used to etch silicon and can also produce hydrogen ($H_2$) and silicon bromide ($SiO_xBr_y$). Silicon bromide may be deposited to protect the underlying oxide layer 15 and photoresist layer 13. Oxygen, silicon and hydrogen may form SiOH polymers (not shown) to protect the sidewall of the trench 19c.

In the embodiment, in the third etching process (E3) (step 4), a flow rate of hydrobromic acid is between 10 sccm and 2000 sccm, a flow rate of oxygen is between 10 sccm and 500 sccm, and a flow rate of helium is between 10 sccm and 500 sccm.

In the embodiment, in the third etching process (E3) (step 4), hydrobromic acid is 60% by volume of the third etching gas (g3), oxygen is 10% by volume of the third etching gas (g3), and helium is 30% by volume of the third etching gas (g3).

In the embodiment, in the third etching process (E3) (step 4), the power of the upper electrode 173 is about 1000 W, and the power of the lower electrode 175 is about 100 W.

In the dry etching process for manufacturing the trench structure of the semiconductor apparatus 10 of the embodiment, the semiconductor structure including a deep trench (trench 19c) is manufactured by adjusting temperature and/or power parameters, applying a specific etching gas, and adjusting the etching parameters. Therefore, micro-trenches are not easy to form on the oxide layer 15 at the bottom, and necking/bowing is not generated on the trenches 19c. The roughness of the sidewall of the trenches 19c can be reduced, the oxide layer 15 is free from micro-trenches, and the yield of semiconductor apparatuses 10 can be improved.

In the dry etching process for manufacturing a trench structure of the semiconductor apparatus 10 in the embodiment, the first etching process (E1), the second etching process (E2) and the third etching process (E3) have sufficient time for reaction, and the roughness of the sidewall of the trench 19c and the profile of the trench 19c can be greatly improved through strict temperature, pressure and power control. The trench 19c of the embodiment may have a sidewall roughness of less than 10 nm, an aspect ratio of greater than 100, and a bottom profile angle between 89.7 degrees and 90.3 degrees. Whereas a trench (not shown) in the prior art typically has a sidewall roughness greater than 100 nm, an aspect ratio typically between 30 and 60, and a trench bottom profile angle typically between 88 and 92 degrees.

The semiconductor apparatus 10 of the embodiment having the trench 19c with a high aspect ratio may be applied to, for example, a microelectromechanical system (MEMS).

In summary, according to the dry etching process for manufacturing a trench structure of a semiconductor apparatus, the first etching process, the second etching process and the third etching process are respectively carried out through the first etching gas, the second etching gas and the third etching gas to manufacture a semiconductor structure with a deep trench, as a result, the quality and stability of the process can be improved, and the yield can be increased.

What is claimed is:

1. A dry etching process for manufacturing a trench structure of a semiconductor apparatus, comprising the steps of:
   step 1, providing a semiconductor substrate, the semiconductor substrate being provided with a photoresist layer which is patterned thereon and placed in a reaction chamber, the semiconductor substrate comprising a reserved area shielded by the photoresist layer and a predetermined etching area which is exposed, and the reaction chamber comprising an upper electrode and a lower electrode;
   step 2, introducing a first etching gas into the reaction chamber to perform a first etching process, and removing a part of the predetermined etching area to form a trench, the trench comprising a first depth, and the first etching gas comprising sulfur hexafluoride, oxygen, helium, nitrogen trifluoride and a first organic silicide;

step 3, introducing a second etching gas into the reaction chamber to perform a second etching process, and etching the trench from the first depth to a second depth, the second etching gas comprising sulfur hexafluoride, oxygen, helium and a second organic silicide, wherein a pressure in the reaction chamber in the second etching process is higher than a pressure in the reaction chamber in the first etching process; and step 4, introducing a third etching gas into the reaction chamber to perform a third etching process, the third etching gas comprising hydrobromic acid, oxygen, and helium;

wherein a temperature in the reaction chamber varies within +/−1% per second, a pressure in the reaction chamber varies within +/−5% per second, and a power of the upper electrode or the lower electrode varies within +/−1% per second.

2. The dry etching process according to claim 1, wherein in the first etching process, a flow rate of sulfur hexafluoride is between 10 sccm and 2000 sccm, a flow rate of oxygen is between 10 sccm and 500 sccm, a flow rate of helium is between 10 sccm and 500 sccm, a flow rate of nitrogen trifluoride is between 10 sccm and 300 sccm, and a flow rate of the first organic silicide is between 50 sccm and 200 sccm.

3. The dry etching process according to claim 1, wherein in the first etching process, sulfur hexafluoride is 30% by volume of the first etching gas, oxygen is 20% by volume of the first etching gas, helium is 20% by volume of the first etching gas, nitrogen trifluoride is 10% by volume of the first etching gas, and the first organic silicide is 20% by volume of the first etching gas.

4. The dry etching process according to claim 1, wherein in the first etching process, a power of the upper electrode is 3000 W, and a power of the lower electrode is 500 W.

5. The dry etching process according to claim 1, wherein in the second etching process, a flow rate of sulfur hexafluoride is between 10 sccm and 2000 sccm, a flow rate of oxygen is between 10 sccm and 500 sccm, a flow rate of helium is between 10 sccm and 500 sccm, and a flow rate of the second organic silicide is between 50 sccm and 200 sccm.

6. The dry etching process according to claim 1, wherein in the second etching process, sulfur hexafluoride is 20% by volume of the second etching gas, oxygen is 20% by volume of the second etching gas, helium is 40% by volume of the second etching gas, and the second organic silicide is 20% by volume of the second etching gas.

7. The dry etching process according to claim 1, wherein in the second etching process, a power of the upper electrode is 7000 W, and a power of the lower electrode is 2000 W.

8. The dry etching process according to claim 1, wherein in the third etching process, a flow rate of hydrobromic acid is between 10 sccm and 2000 sccm, a flow rate of oxygen is between 10 sccm and 500 sccm, and a flow rate of helium is between 10 sccm and 500 sccm.

9. The dry etching process according to claim 1, wherein in the third etching process, hydrobromic acid is 60% by volume of the third etching gas, oxygen is 10% by volume of the third etching gas, and helium is 30% by volume of the third etching gas.

10. The dry etching process according to claim 1, wherein in the third etching process, a power of the upper electrode is 1000 W, and a power of the lower electrode is 100 W.

* * * * *